United States Patent
Ihnfeldt (10) Patent No.: US 8,980,122 B2
(45) Date of Patent: Mar. 17, 2015

(54) CONTACT RELEASE CAPSULE USEFUL FOR CHEMICAL MECHANICAL PLANARIZATION SLURRY

(75) Inventor: Robin Ihnfeldt, San Diego, CA (US)

(73) Assignee: General Engineering & Research, L.L.C., San Diego, CA (US)

( * ) Notice: Subject to any disclaimer, the term of this patent is extended or adjusted under 35 U.S.C. 154(b) by 61 days.

(21) Appl. No.: 13/542,651

(22) Filed: Jul. 5, 2012

(65) Prior Publication Data
US 2013/0280910 A1    Oct. 24, 2013

Related U.S. Application Data

(60) Provisional application No. 61/505,835, filed on Jul. 8, 2011.

(51) Int. Cl.
| | |
|---|---|
| C09K 13/06 | (2006.01) |
| C09C 1/02 | (2006.01) |
| H01L 21/306 | (2006.01) |
| C09K 3/14 | (2006.01) |
| C08K 9/00 | (2006.01) |

(52) U.S. Cl.
CPC ............ *C09C 1/02* (2013.01); *H01L 21/30625* (2013.01); *C09K 3/1454* (2013.01); *C08K 9/00* (2013.01); *C09K 3/1436* (2013.01)
USPC ........... 252/79.4; 252/79.1; 216/88; 438/692; 438/693

(58) Field of Classification Search
CPC ................................ C09K 3/1454; C08K 9/00
See application file for complete search history.

(56) References Cited

U.S. PATENT DOCUMENTS

| | | |
|---|---|---|
| 5,780,358 A | 7/1998 | Zhou et al. |
| 5,876,266 A | 3/1999 | Miller et al. |
| 5,954,997 A | 9/1999 | Kaufman et al. |

(Continued)

FOREIGN PATENT DOCUMENTS

| | | |
|---|---|---|
| EP | 1078717 A2 | 2/2001 |
| WO | WO 2014/007836 A1 | 1/2014 |

OTHER PUBLICATIONS

International Search Report for International Application No. PCT/US2012/058810 dated Jan. 2, 2013.

(Continued)

*Primary Examiner* — Binh X Tran
*Assistant Examiner* — David Cathey, Jr.
(74) *Attorney, Agent, or Firm* — Knobbe Martens Olson & Bear LLP (57) ABSTRACT

The invention relates to a contact release capsule comprising a particle, a chemical payload, and a polymer coating, wherein the particle is impregnated with the chemical payload, and the chemical payload is held inside the particle by the polymer coating until the contact release capsule contacts a surface and a shearing force removes the polymer coating allowing the chemical payload to release outside the particle. The contact release capsule is useful in chemical mechanical planarization slurries. Particularly, the contact release capsule may comprise a glycine impregnated silica nanoparticle coated with a polymer, wherein the contact release capsule is dispersed in an aqueous solution and used in the copper chemical mechanical planarization process. Use of the contact release capsule in a slurry for copper chemical mechanical planarization may significantly improve planarization efficiency, decrease unwanted etching and corrosion, and improve dispersion stability.

18 Claims, 5 Drawing Sheets

(56) References Cited

U.S. PATENT DOCUMENTS

| | | | |
|---|---|---|---|
| 6,126,853 | A | 10/2000 | Kaufman et al. |
| 6,309,560 | B1 | 10/2001 | Kaufman et al. |
| 6,375,545 | B1 * | 4/2002 | Yano et al. ............... 451/36 |
| 6,432,828 | B2 | 8/2002 | Kaufman et al. |
| 6,447,371 | B2 | 9/2002 | Brusic Kaufman et al. |
| 6,491,061 | B1 * | 12/2002 | Lopez et al. ............ 137/599.01 |
| 6,569,350 | B2 | 5/2003 | Kaufman et al. |
| 6,620,037 | B2 | 9/2003 | Kaufman et al. |
| 6,764,574 | B1 | 7/2004 | Obeng et al. |
| 6,797,626 | B2 | 9/2004 | Miyairi et al. |
| 7,973,105 | B2 | 7/2011 | Armini |
| 2003/0220061 | A1 * | 11/2003 | Prasad ..................... 451/526 |
| 2004/0043702 | A1 * | 3/2004 | Singh ...................... 451/36 |
| 2004/0082274 | A1 | 4/2004 | Leng |
| 2004/0127045 | A1 | 7/2004 | Gorantla et al. |
| 2005/0055885 | A1 | 3/2005 | Obeng |
| 2005/0189319 | A1 | 9/2005 | Guthrie et al. |
| 2006/0024434 | A1 | 2/2006 | Wang et al. |
| 2006/0135374 | A1 | 6/2006 | Cooper et al. |
| 2007/0117394 | A1 | 5/2007 | Shinoda et al. |
| 2007/0147551 | A1 | 6/2007 | Mabuchi et al. |
| 2007/0179238 | A1 * | 8/2007 | Armini ..................... 524/493 |
| 2008/0020051 | A1 | 1/2008 | Dahne et al. |
| 2008/0254628 | A1 | 10/2008 | Boggs et al. |
| 2009/0101625 | A1 | 4/2009 | Bakshi et al. |
| 2009/0224200 | A1 | 9/2009 | Jha et al. |
| 2010/0101448 | A1 | 4/2010 | Sawayda et al. |
| 2010/0164106 | A1 | 7/2010 | Lee et al. |
| 2010/0178768 | A1 | 7/2010 | Li |
| 2010/0258528 | A1 | 10/2010 | Singh et al. |

OTHER PUBLICATIONS

U. Paik et al., "Nanoparticle Engineering for Chemical-Mechanical Planarization", CRC Press, Boca Raton, FL, 2009.

R. Ihnfeldt, "The Effects of Slurry Chemistry on the Colloidal Behavior of Alumina Surries and Copper Nanohardness for Copper Chemical Mechanical Planarization", Ph.D. Dissertation, University of California, San Diego, 2008.

R.V. Ihnfeldt et al., "Effect of CMP Slurry Chemistry on Copper Nanohardness", J. Electrochemical Soc., 155, H412, 2008.

S. Pandija et al., "Microelectronic Engineering", 86, 367, 2009.

Choi et al, "Mat. Res. Soc. Symp. Proc.," 671 (2001).

Singh et al., "J. Hazardous Materials", 161, 933 (2009).

R.V. Ihnfeldt et al., "Modeling Material Removal Rates for Copper CMP Using Copper Nanohardness and Etch Rates", J. Electrochemical Soc., 155, H582 (2008).

Y.S. Chung et al., Colloids and Surfaces A: Physicochem. Eng. Aspects, 236, 73 (2004).

Wang et al., "Developed a Method to Encapsulate Nanoparticles in a Polymer using a Supercritical Anti-solvent Process", Journal of Supercritical Fluids, 28, 85 (2004).

R. Ihnfeldt et al., "Modeling of Copper CMP Using the Colloidal Behavior of an Alumina Slurry with Copper Nanoparticles", J. Electrochemical Soc., 154, H1018 (2007).

S.R. Bhattarai et al., "Journal of Nanobiotechnology", 6, 1 (2008).

T. Wang et al., "Advances in Colloid and Interface Science", 147-148, 319 (2009).

Y. Zhang et al., "Journal of Colloid and Interface Science", 283, 352 (2005).

H.S. Lee et al., "Journal of Magnetic Materials", 293, 102 (2005).

J.S. Kim et al., "Journal of Veterinary Science", 7, 321 (2006).

R. Trehin et al., "Neoplasia", 8, 302 (2006).

J.H. Clement, et al., "Journal of Cancer Research and Clinical Oncology", 132, 287 (2006).

A.P. Herrera et al., "Journal of Colloid and Interface Science", vol. 342, issue 540 (2010).

S.R. Pullela, Ph.D. Dissertation, Texas A&M University (2009).

PCT International Preliminary Report for International Application No. PCT/US2012/058810 mailed on Jan. 6, 2015 by The International Bureau of WIPO.

* cited by examiner

CONTACT RELEASE CAPSULE USEFUL FOR CHEMICAL MECHANICAL PLANARIZATION SLURRY

CROSS-REFERENCE TO RELATED APPLICATIONS

This application claims priority to U.S. Provisional Patent Application No. 61/505,835, entitled "Contact Release Capsule Useful for Chemical Mechanical Planarization Slurry", filed on Jul. 7, 2011, the contents of which are incorporated herein by reference in their entirety.

BACKGROUND OF THE INVENTION

1. Field of the Invention

The invention relates to a contact release capsule comprising a particle, a chemical payload, and a polymer coating, wherein the particle is impregnated with the chemical payload, and the chemical payload is held inside the particle by the polymer coating until the contact release capsule contacts a surface and a shearing force removes the polymer coating allowing the chemical payload to release outside the particle. The contact release capsule is useful in chemical mechanical planarization slurries.

2. Description of the Related Art

Chemical Mechanical Planarization (CMP) was first introduced in the early 1980's by IBM as a semiconductor manufacturing process used to remove material and planarize a wafer surface. Since then, CMP has enabled the continuous scale down of semiconductor device sizes and the introduction of many new materials, including the use of copper interconnects. The CMP process consists of a polishing pad and an aqueous slurry containing chemicals and abrasive nanoparticles. The wafer surface to be planarized is rotated against the polishing pad which is continuously supplied with slurry. The synergistic combination of mechanical abrasion and chemical etching creates high material removal rates (MRR) and rapid planarization. In depth reviews of the CMP process can be found in the literature, for example see "Nanoparticle Engineering for Chemical-Mechanical Planarization" by U. Paik and J. Park, CRC Press, Boca Raton, Fla. (2009), or "*The Effects of Slurry Chemistry on the Colloidal Behavior of Alumina Slurries and Copper Nanohardness for Copper Chemical Mechanical Planarization*", by R. Ihnfeldt, Ph.D. Dissertation, University of California, San Diego (2008).

Currently, CMP is used on a variety of surfaces including aluminum, tungsten, various oxides and nitrides, copper, and nickel, to name a few. Despite numerous advancements in slurry technologies, significant improvements are still needed. Commercial slurry products containing silica, alumina, ceria, ZnO, or TiO as their abrasive nanoparticles have been developed over the last several decades. Manufacturers have even developed composite nanoparticles of porous silica coated with ceria, colloidal alumina spotted with various metals, and metal oxide/polymer nanoparticle composites, see U.S. Patent Application Publication No. 2010/0258528, and U.S. Pat. No. 6,764,574, which are hereby incorporated by reference in their entirety. Chemical components in slurries include complexing agents, oxidizers, corrosion inhibitors, surfactants, and all types of acids and bases to control the pH of the solution.

SUMMARY OF THE INVENTION

While a plethora of slurry products have been developed, no known work has attempted to use the nanoparticle to deliver a localized chemical payload simultaneously with mechanical abrasion to the wafer surface. Therefore, the purpose of this invention is to significantly improve CMP slurry technology by incorporating the chemical action of the slurry into the abrasive nanoparticle, to create a localized simultaneous chemical and mechanical action on the wafer surface.

Over the last several decades manufacturers have made tremendous improvements in slurry nanoparticle dispersions and have tediously and meticulously formulated a variety of slurry chemistries. In the last several years, equipment and consumable manufactures have focused their development efforts on revolutionary predicted future chip design technologies, such as 3D wafer level packaging (3D-WLP) and stacked integrated circuit (3D-SIC), and thru silicon vias (TSVs), and made minimal efforts at improving current technologies to enable the continued scale down of device sizes using current chip designs. One of the processing steps which will require further improvement to enable scale down using current manufacturing methods is copper CMP. Currently, copper CMP slurry solutions require a complexing agent, such as glycine, to maintain an adequate MRR, which at the same time, also causes static etching and dissolution (i.e. corrosion) of the wafer surface which is difficult to control. If the exposure of the complexing agent to the copper surface could be controlled so that only the abraded areas were affected, then static etching and corrosion could be reduced or eliminated. Therefore, one aspect of this invention is to significantly improve current copper CMP slurry technology by combining the complexing agent into the abrasive nanoparticle, so that mechanical and chemical actions of the slurry are localized and simultaneous, thus improving processing efficiency and tolerances.

Just in the last few years there has been an enormous interest in developing technologies to enable the expected future chip design technologies (3D-WLP, 3D-SIC, TSVs, etc.). Equipment and consumable manufacturers predict semiconductor manufacturers to move to these new technologies within the next decade. Companies like Sinmat Inc. have developed numerous revolutionary CMP slurries to tackle the tough materials (SiC, GaN, Diamond, etc.) required for future chip designs, as have many equipment and other CMP consumable manufacturers, such as psiloQuest Inc., see U.S. Patent Application Publication Nos. 20100258528, and 20050055885, which are hereby incorporated by reference in their entirety. As of yet, however, many semiconductor manufacturers have been reluctant to implement the new chip designs as the cost of ownership is just too high, requiring new tool and consumable sets, and unproven processes. Herein lies the problem. While chip manufacturers would like to continue the incremental scale down of their product as they have in the past, with minimal process and tool set changes, equipment manufacturers have focused all their development efforts on these revolutionary future chip designs, leaving a gap between what is needed and what is available. This has left many chip manufacturers to fend for themselves, basically developing their own CMP slurries, and modifying tool sets themselves. Because of this, a significant potential market exists for suppliers with products that will allow chip manufacturers to continue processing using current methods, versus forcing them to implement new unproven processes. Improvements in CMP slurry technologies to improve current processing tolerances and efficiency, would be very valuable to chip manufacturers as it would enable the most economical solution to continue scale down of their product. Furthermore, even the new chip designs (3D-SIC) will still require many of the same CMP processing steps (like copper CMP) but they will need to maintain tighter tolerances, so having the ability to perform these steps using current tool sets will be a very attractive option for chip manufacturers.

Therefore, the present invention provides a revolutionary technology to significantly improve CMP slurries. An embodiment of the invention comprises a contact release capsule, wherein the contact release capsule comprises a particle, a chemical payload, and a polymer coating. In an embodiment, the particle comprises a pore or pores which can be impregnated with a chemical payload. In an embodiment, the chemical payload remains contained in the particle due to the polymer coating which is present on the outside surface of the particle. In an embodiment, when the particle contacts a surface and a pre-specified shearing force occurs, the polymer coating is removed, and the chemical payload is free to move away from the particle and into the outside environment.

CMP slurries typically comprise nano-sized abrasive particles dispersed in an aqueous solution. In an embodiment of the contact release capsule, the particle comprises a metal, a metal oxide, a polymer, and/or a composite made of combinations thereof.

In an embodiment of the contact release capsule, the particle is selected from the group consisting of fumed or colloidal silica, fumed or colloidal alumina, ceria, $MnO_2$, ZnO, TiO, any polymer material, and/or combinations thereof.

The particle may be any shape. In an embodiment, the particle is spherical.

In an embodiment, the particle may also be a single walled carbon nanotube or a multi-walled carbon nanotube, wherein the inside tube of the single or multi-walled nanotube is the pore of the particle in which a chemical payload can be impregnated.

The contact release capsule may be a variety of sizes. The particle may be a variety of sizes, and the thickness of the polymer coating may also be a variety of sizes. In an embodiment, the size of the contact release capsule is in the range of about 1 nm to about 1 mm. In an embodiment, the size of the contact release capsule is in the range of about 10 nm to about 1 µm. In an embodiment, the size of the particle is in the range of about 1 nm to about 1 mm. In an embodiment, the size of the particle is in the range of about 10 nm to about 1 µm.

The particle comprises a pore or pores wherein the chemical payload can be impregnated. The pore or pores of the particle are essentially the storage space for the chemical payload. Particles with high porosity can be impregnated with a larger quantity of chemical payload, while particles with low porosity will contain less chemical payload. In an embodiment, the particle has a porosity in the range of about 0.01 $cm^3$/g to about 0.5 $cm^3$/g.

In the contact release capsule, the particle is impregnated with a chemical payload that is a chemical compound. In an embodiment, the chemical payload is an organic or inorganic compound. In an embodiment, the chemical payload comprises a complexing agent selected from the group consisting of an organic polymer, alkaline agent, or organic amine. In an embodiment, the chemical payload is a compound selected from the group consisting of glycine, ethylene-diamine-tetra-acetic-acid, alanine, phthalic acid, citric acid, oxalic acid, acetic acid, tartaric acid, succinic acid, amino acid, ammonium hydroxalate, lactic acid, carboxyl group, amine group, and/or combinations thereof.

It may be desirable to use a chemical payload that reacts with the surface of the wafer during CMP. For CMP slurries that are aqueous based, it may be desirable to utilize a chemical payload which is soluble in water, such that it can react with the surface of the wafer during CMP. In an embodiment, the chemical payload is soluble in water. The solubility of the chemical payload in water may vary from 0.001 g/L to 100 g/L.

In an embodiment, the polymer coating comprises at least one moiety of a repeating unit selected from the group consisting of polyacrylate, polymethacrylate, polyethyleneglycol, poly-L-lysine, poly-vinyl alcohol, polysaccharides, polyethylene, polypropylene, poly-vinyl acetate, polyisoprene, and/or any combination thereof.

In an embodiment, the polymer coating is a smart polymer. In an embodiment, the polymer coating is poly(N-isopropylacrylamide) or poly(N-isopropylmethacrylamide).

It may be desirable to enhance stability of the contact release capsule in a liquid by utilizing a polymer which helps keep the contact release capsule dispersed in the liquid. In an embodiment, the polymer coating is hydrophobic. In an embodiment, the polymer coating is hydrophilic.

In an embodiment, the chemical payload is sealed inside the particle by the polymer coating such that liquids or gases cannot penetrate the polymer coating. In an embodiment, the chemical payload is in the form of a solid substance inside the particle.

In an embodiment, the polymer coating is designed to allow a liquid or a gas which is outside of the capsule, the ability to penetrate through it, but not allow the molecules of the chemical payload to penetrate through the polymer coating, therein allowing the chemical payload to solubilize in the liquid or gas inside of the particle without letting the chemical payload escape until the polymer coating is removed during contact shearing with a surface.

In an embodiment, the thickness of the polymer coating on the capsule is in the range of about 0.1 nm to about 1 mm. In an embodiment, the thickness of the polymer coating on the capsule is in the range of about 1 nm to about 1 µm.

The contact release capsule is useful in CMP slurries. Therefore a further aspect of the invention provides a slurry comprising a mixture of the contact release capsules, as disclosed herein, and a liquid solution.

CMP slurries are typically aqueous based. In an embodiment of the slurry, the liquid solution comprises water.

There are several methods that can be used to disperse colloids or particles into solution. In an embodiment, the contact release capsules are dispersed into the liquid solution by ultrasonication.

The pH of the slurry is an important parameter during CMP, as this controls the reactions that occur in the slurry and on the wafer surface. In an embodiment, the slurry further comprises an acid or base to obtain the desired pH. In an embodiment, an acid such as $H_2SO_4$, HCl, HF, Citric acid, acetic acid, or tartaric acid, is used to adjust the pH to a value lower than 7.0. In an embodiment, a base such as Sodium hydroxide, Potassium hydroxide, ammonia, Barium hydroxide, Caesium hydroxide, Strontium hydroxide, Calcium hydroxide, Magnesium hydroxide, Lithium hydroxide, or Rubidium hydroxide, is used to adjust the pH to a value higher than 7.0.

In an embodiment, the slurry pH is in the range of about 1.0 to about 12.0.

The amount of contact release capsules in the slurry may vary. In an embodiment, the contact release capsules are dispersed into the liquid solution in a concentration of about 0.01 wt % to about 99.0 wt %. In an embodiment, the contact release capsules are dispersed into the liquid solution in a concentration of about 1.0 wt % to about 40 wt %.

CMP slurries typically have a variety of chemical components in them. In an embodiment, the slurry further comprises a complexing agent. In an embodiment, the slurry further comprises an oxidizer. In an embodiment, the oxidizer is selected from the group consisting of peroxide, oxalic acid, and/or combinations thereof. In an embodiment, the slurry further comprises a corrosion inhibitor. In an embodiment, the corrosion inhibitor is selected from the group consisting of benzotriazole, 3-amino-triazole, potassium iodate, and/or combinations thereof. In an embodiment, the slurry further comprises a surfactant. In an embodiment, the surfactant is selected from the group consisting of sodium-dodecyl-sulfate, cetyltrimethyl-ammonium-bromide, carboxylic acid, polyacrylic acid, and/or combinations thereof.

There are a variety of techniques that may be employed to manufacture the contact release capsules, disclosed herein. Therefore, a further aspect of the invention is a method of manufacturing the contact release capsules. An embodiment of a method of manufacturing the contact release capsules, as disclosed herein, comprises the steps of 1) synthesizing porous particles 2) impregnating the particles with the chemical payload 3) coating the particles with a polymer.

In an embodiment of the method, the porous particles are synthesized using a Stober method, and/or a modification thereof.

In an embodiment of the method, the particles are impregnated using an incipient wetness technique, and/or a modification thereof.

In an embodiment of the method, the particles are coated using a free radical polymerization technique, and/or a modification thereof.

CMP slurries are used to planarize and/or polish a wafer surface. Therefore, a further aspect of the invention is a method of planarizing and/or polishing a wafer surface comprising performing the chemical mechanical planarization process, wherein the slurry utilized in the process is any of the slurries as disclosed herein. In an embodiment of the method, the wafer surface to be planarized and/or polished comprises a metal, a metal oxide, an oxide, a nitride, a polymer material, and/or any combination thereof. In an embodiment of the method, the wafer surface comprises Copper, Tungsten, Tantalum, Tin, Tantalum nitride, Silicon nitride, Aluminum, Nickel, Nickel Phosphor, Nickel nitride, Silver, Gold, Platinum, Ruthenium, and/or any combination thereof. In an embodiment of the method, the wafer surface comprises tetraethylorthosilicate, $Ni_3Si_4$, silica, diamond, SiC, polysilicon, and/or any combination thereof. In an embodiment of the method, the chemical mechanical planarization process is Copper CMP, shallow trench isolation CMP, Tungsten CMP, interlayer dielectric CMP, or polysilicon CMP.

DETAILED DESCRIPTION OF THE INVENTION

The present invention provides a novel innovation to significantly improve CMP slurries. During CMP, the wafer surface to be planarized is rotated against a polishing pad, typically a polymer material, and an aqueous based slurry containing nanoparticles is continuously dispersed onto the polishing pad. Researchers have concurred that the majority of the removal from the wafer surface occurs due to solid-solid contact of the abrasive particle with the wafer surface, that is, the abrasive particle is embedded into the polishing pad and the wafer surfaced is pressed down onto the pad containing the embedded particle. Plastic deformation of the wafer surface occurs as the abrasive particle indents into the wafer surface, and the rotating action of the wafer creates a shearing force against the particle, causing the particle to deform and remove material on the wafer surface. The focus of the disclosed invention exploits this phenomena by creating a particle which has the ability to not only provide mechanical action on the wafer surface, but to also provide a chemical action.

An embodiment of the invention comprises a contact release capsule, wherein the contact release capsule comprises a particle, a chemical payload, and a polymer coating. In an embodiment, the particle comprises a pore or pores which can be impregnated with a chemical payload. In an embodiment, the chemical payload remains contained in the particle due to the polymer coating which is present on the outside surface of the particle. In an embodiment, when the particle contacts a surface and a pre-specified shearing force occurs, the polymer coating is removed, and the chemical payload is free to move away from the particle and into the outside environment. The contact release capsule is useful in CMP slurries. It allows a localized and simultaneous mechanical and chemical action on the wafer surface.

Figure 1:
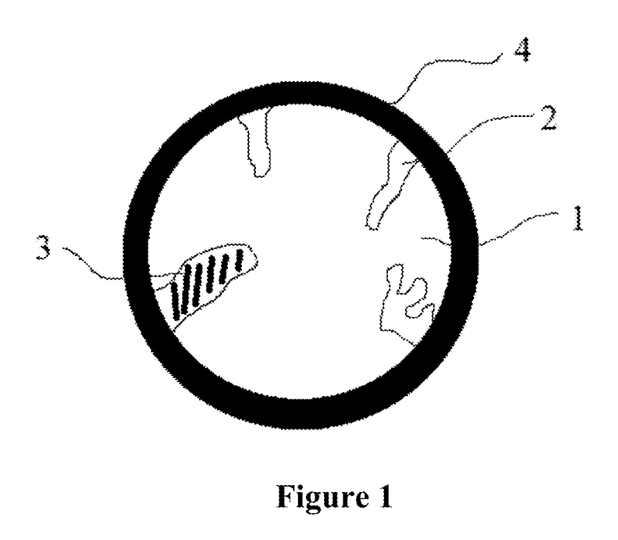
FIG. 1 Schematic representation of an embodiment of the Contact Release Capsule.

FIG. 1 shows a schematic representation of an embodiment of the Contact Release Capsule prior to encountering a shearing contact force with a wafer surface. The particle 1 has pores 2 which can be impregnated with a chemical payload 3, and the particle is encapsulated by a polymer coating 4. When the particle contacts a wafer surface and a shearing force occurs, the polymer coating is removed, and the chemical payload is exposed to the wafer surface and outside environment.

Figure 2:
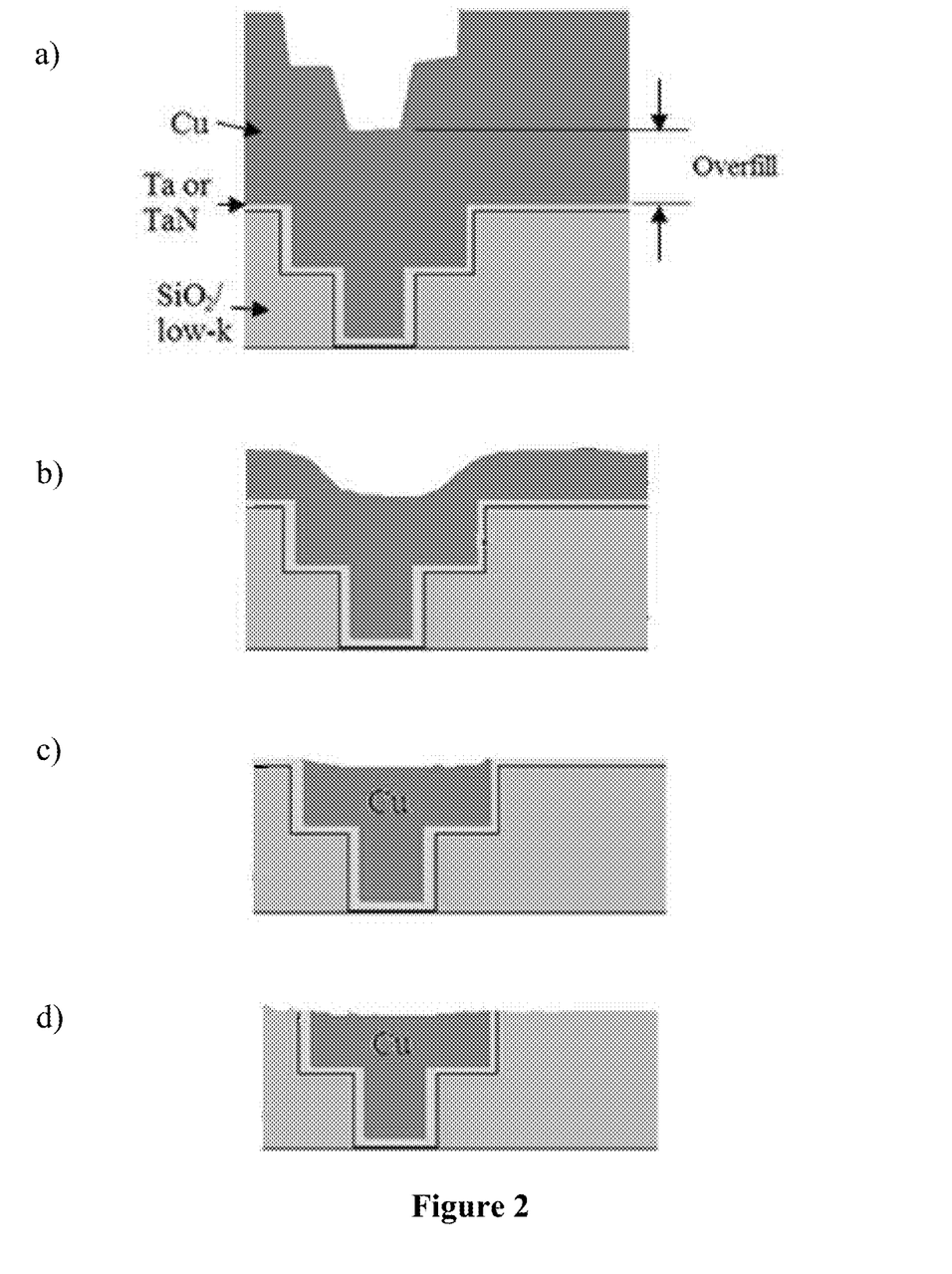
FIG. 2 Schematic of the Copper CMP process.

FIG. 2 shows a schematic of the Copper CMP process comprising the following steps: a) the incoming wafer is overfilled with Cu to account for static etching and surface dissolution during Cu CMP; b) the first step of Cu CMP is bulk Cu removal where mechanical abrasion occurs mainly at the wafer high points, and static etching and surface dissolution (corrosion) occurs at all exposed surfaces, causing dishing and erosion and decreasing planarization efficiency; c) the second step of Cu CMP is Cu planarization/stop on barrier; and d) the third step of Cu CMP is barrier removal.

Figure 3:
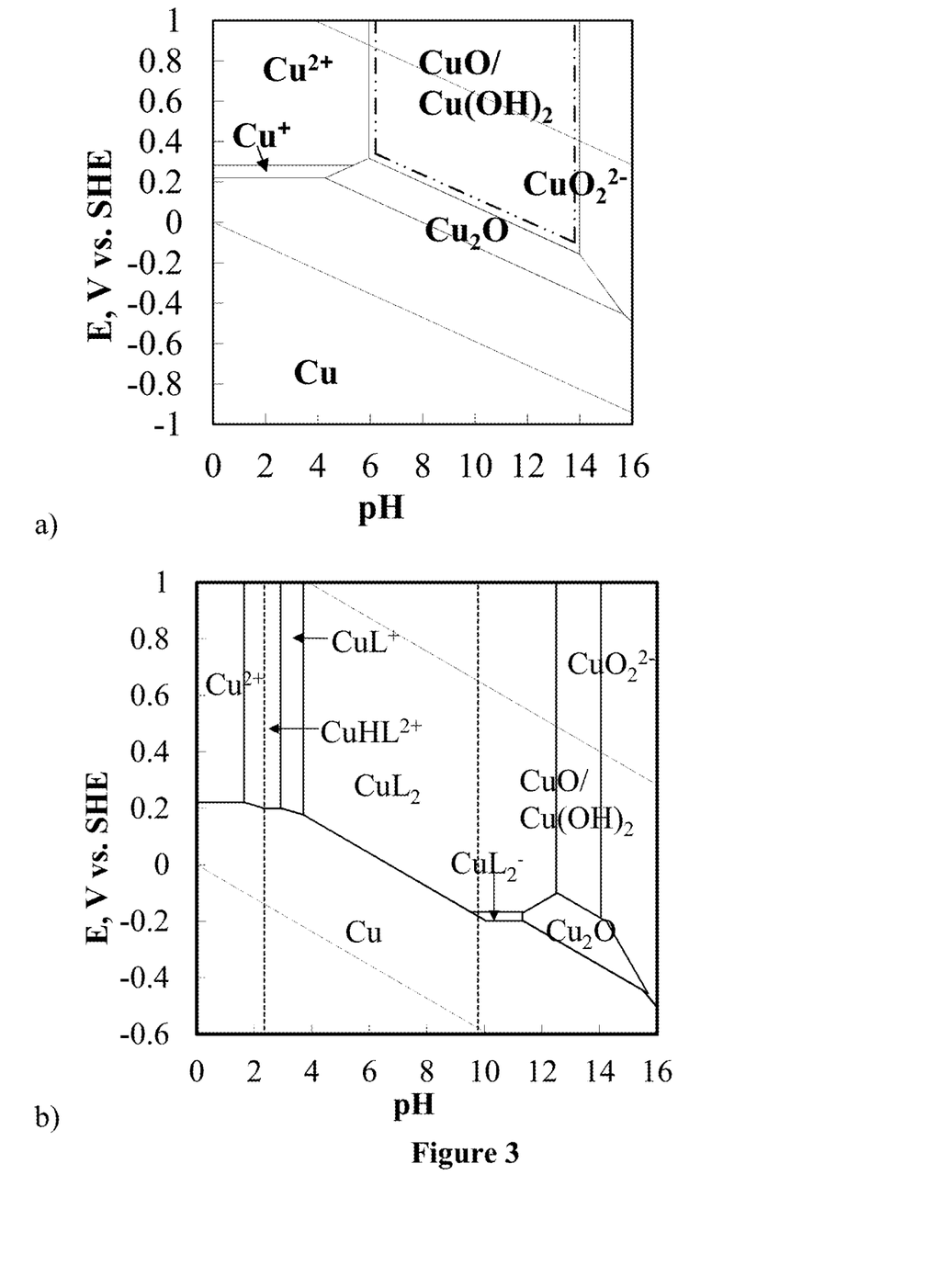
FIG. 3 Potential-pH diagram for the a) copper-water and b) copper-water-glycine systems at total dissolved copper activity of $10^{-4}$M and a total glycine activity of 0.1M at 25° C. and 1 atm.

FIG. 3 shows the potential-pH diagram for the a) copper-water and b) copper-water-glycine systems at total dissolved copper activity of $10^{-4}$M and a total glycine activity of 0.1M at 25° C. and 1 atm.

Figure 4:
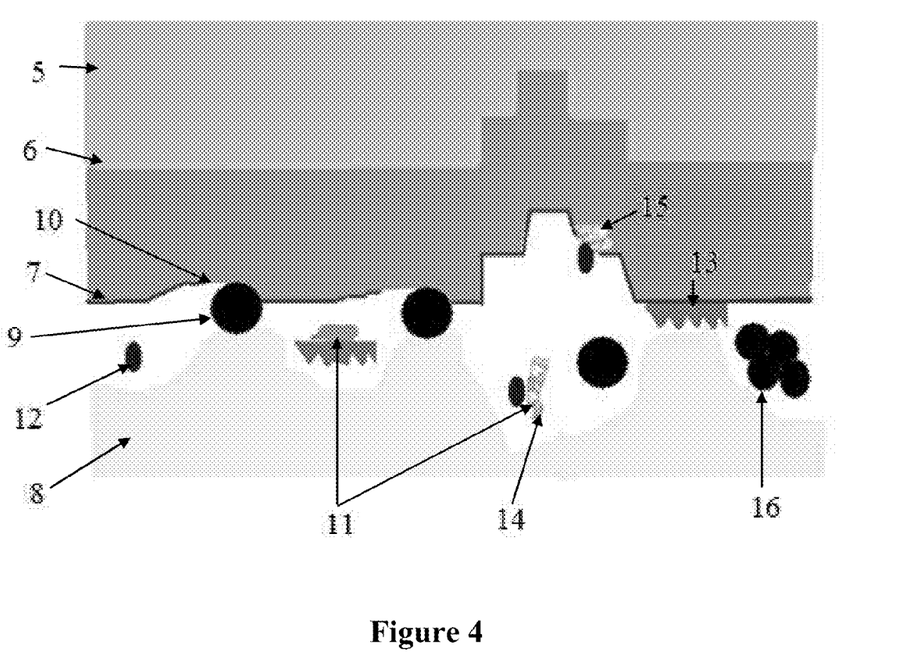
FIG. 4 Schematic of typical Copper CMP mechanisms during processing.

FIG. 4 shows a schematic of typical Copper CMP mechanisms during processing. The wafer to be planarized comprises a layer of SiO2 or low-k material 5, with a layer of Ta or TaN 6, and a layer of Copper. Exposure to the slurry causes formation of a copper oxide 7 on the surface of the wafer. The wafer is pressed against the polishing pad 8 which has abrasive particles 9 from the slurry on top. The abrasive particles provide mechanical abrasion 10 of the copper oxide, producing copper pieces 11 in the slurry. Complexing agents 12 and corrosion inhibitors 13 are contained in the slurry. The complexing agent acts to dissolve 14 the copper pieces in the slurry, while also causing corrosion on the wafer surface 15. The corrosion inhibitor acts to prevent corrosion on the wafer surface, while also preventing copper dissolution in the slurry. Additionally, the presence of multiple chemicals in the slurry increases the ionic strength of the solution, which often leads to agglomeration 16 of the particles.

Figure 5:
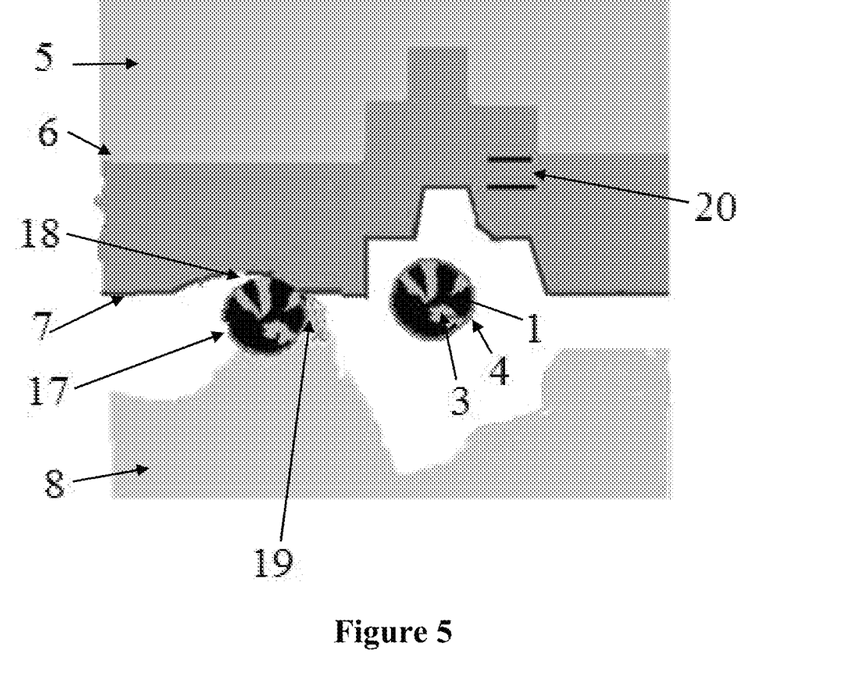
FIG. 5 Schematic of removal mechanism for the contact release capsule technology in a copper CMP slurry.

FIG. 5 shows a schematic of removal mechanism for the contact release capsule technology in a copper CMP slurry. Similarly, the wafer to be planarized comprises a layer of $SiO_2$ or low-k material 5, with a layer of Ta or TaN 6, and a layer of copper. Exposure to the slurry causes formation of a copper oxide 7 on the surface of the wafer. The wafer is pressed against the polishing pad 8 which has the Nano-CRC particles 17 from the slurry on top. The Nano-CRC particles comprise a porous silica particle 1, with a complexing agent such as glycine impregnated in the pores 3, and a polymer coating 4 to encapsulate the particle. When the Nano-CRC particle contacts the wafer surface, the polymer coating is removed exposing the complexing agent to the wafer surface. The Nano-CRC particles provide simultaneous localized mechanical and chemical removal 18 of the copper oxide, with immediate copper dissolution of the abraded copper pieces 19. There is no corrosion or static etching of the copper surface, which reduces the amount of incoming copper required 20. No additional chemicals are required in the slurry which means the Nano-CRC particle is easily stabilized in solution (no agglomeration).

CMP slurries typically comprise nano-sized abrasive particles dispersed in an aqueous solution. In an embodiment of the contact release capsule, the particle comprises a metal, a metal oxide, a polymer, and/or a composite made of combinations thereof.

In an embodiment of the contact release capsule, the particle is selected from the group consisting of fumed or colloidal silica, fumed or colloidal alumina, ceria, $MnO_2$, ZnO, TiO, any polymer material, and/or combinations thereof.

The particle may be any shape. In an embodiment, the particle is spherical.

In an embodiment, the particle may also be a single walled carbon nanotube or a multi-walled carbon nanotube, wherein the inside tube of the single or multi-walled nanotube is the pore of the particle in which a chemical payload can be impregnated.

The contact release capsule may be a variety of sizes. The particle may be a variety of sizes, and the thickness of the polymer coating may also be a variety of sizes. In an embodiment, the size of the contact release capsule is in the range of about 1 nm to about 1 mm. In an embodiment, the size of the contact release capsule is in the range of about 10 nm to about 1 μm. In an embodiment, the size of the particle is in the range of about 1 nm to about 1 mm. In an embodiment, the size of the particle is in the range of about 10 nm to about 1 μm.

The particle comprises a pore or pores wherein the chemical payload can be impregnated. The pore or pores of the particle are essentially the storage space for the chemical payload. Particles with high porosity can be impregnated with a larger quantity of chemical payload, while particles with low porosity will contain less chemical payload. In an embodiment, the particle has a porosity in the range of about 0.01 $cm^3$/g to about 0.5 $cm^3$/g.

In the contact release capsule, the particle is impregnated with a chemical payload that is a chemical compound. In an embodiment, the chemical payload is an organic or inorganic compound. In an embodiment, the chemical payload comprises a complexing agent selected from the group consisting of an organic polymer, alkaline agent, or organic amine. In an embodiment, the chemical payload is a compound selected from the group consisting of glycine, ethylene-diamine-tetra-acetic-acid, alanine, phthalic acid, citric acid, oxalic acid, acetic acid, tartaric acid, succinic acid, amino acid, ammonium hydroxalate, lactic acid, carboxyl group, amine group, and/or combinations thereof.

It may be desirable to use a chemical payload that reacts with the surface of the wafer during CMP. For CMP slurries that are aqueous based, it may be desirable to utilize a chemical payload which is soluble in water, such that it can react with the surface of the wafer during CMP. In an embodiment, the chemical payload is soluble in water. The solubility of the chemical payload in water may vary from 0.001 g/L to 100 g/L.

In an embodiment, the polymer coating comprises at least one moiety of a repeating unit selected from the group consisting of polyacrylate, polymethacrylate, polyethyleneglycol, poly-L-lysine, poly-vinyl alcohol, polysaccharides, polyethylene, polypropylene, poly-vinyl acetate, polyisoprene, and/or any combination thereof.

In an embodiment, the polymer coating is a smart polymer. In an embodiment, the polymer coating is poly(N-isopropylacrylamide) or poly(N-isopropylmethacrylamide).

It may be desirable to enhance stability of the contact release capsule in a liquid by utilizing a polymer which helps keep the contact release capsule dispersed in the liquid. In an embodiment, the polymer coating is hydrophobic. In an embodiment, the polymer coating is hydrophilic.

In an embodiment, the chemical payload is sealed inside the particle by the polymer coating such that liquids or gases cannot penetrate the polymer coating. In an embodiment, the chemical payload is in the form of a solid substance inside the particle.

In an embodiment, the polymer coating is designed to allow a liquid or a gas which is outside of the capsule, the ability to penetrate through it, but not allow the molecules of the chemical payload to penetrate through the polymer coating, therein allowing the chemical payload to solubilize in the liquid or gas inside of the particle without letting the chemical payload escape until the polymer coating is removed during contact shearing with a surface.

In an embodiment, the thickness of the polymer coating on the capsule is in the range of about 0.1 nm to about 1 mm. In an embodiment, the thickness of the polymer coating on the capsule is in the range of about 1 nm to about 1 μm.

The contact release capsule is useful in CMP slurries. Therefore a further aspect of the invention provides a slurry comprising a mixture of the contact release capsules, as disclosed herein, and a liquid solution.

CMP slurries are typically aqueous based. In an embodiment of the slurry, the liquid solution comprises water.

There are several methods that can be used to disperse colloids or particles into solution. In an embodiment, the contact release capsules are dispersed into the liquid solution by ultrasonication.

The pH of the slurry is an important parameter during CMP, as this controls the reactions that occur in the slurry and on the wafer surface. In an embodiment, the slurry further comprises an acid or base to obtain the desired pH. In an embodiment, an acid such as $H_2SO_4$, HCl, HF, Citric acid, acetic acid, or tartaric acid, is used to adjust the pH to a value lower than 7.0. In an embodiment, a base such as Sodium hydroxide, Potassium hydroxide, ammonia, Barium hydroxide, Caesium hydroxide, Strontium hydroxide, Calcium hydroxide, Magnesium hydroxide, Lithium hydroxide, or Rubidium hydroxide, is used to adjust the pH to a value higher than 7.0.

In an embodiment, the slurry pH is in the range of about 1.0 to about 12.0.

The amount of contact release capsules in the slurry may vary. In an embodiment, the contact release capsules are dispersed into the liquid solution in a concentration of about 0.01 wt % to about 99.0 wt %. In an embodiment, the contact release capsules are dispersed into the liquid solution in a concentration of about 1.0 wt % to about 40 wt %.

CMP slurries typically have a variety of chemical components in them. In an embodiment, the slurry further comprises a complexing agent. In an embodiment, the slurry further comprises an oxidizer. In an embodiment, the oxidizer is selected from the group consisting of peroxide, oxalic acid, and/or combinations thereof. In an embodiment, the slurry further comprises a corrosion inhibitor. In an embodiment, the corrosion inhibitor is selected from the group consisting of benzotriazole, 3-amino-triazole, potassium iodate, and/or combinations thereof. In an embodiment, the slurry further comprises a surfactant. In an embodiment, the surfactant is selected from the group consisting of sodium-dodecyl-sulfate, cetyltrimethyl-ammonium-bromide, carboxylic acid, polyacrylic acid, and/or combinations thereof.

There are a variety of techniques that may be employed to manufacture the contact release capsules, disclosed herein. Therefore, a further aspect of the invention is a method of manufacturing the contact release capsules. An embodiment of a method of manufacturing the contact release capsules, as disclosed herein, comprises the steps of 1) synthesizing porous particles 2) impregnating the particles with the chemical payload 3) coating the particles with a polymer.

In an embodiment of the method, the porous particles are synthesized using a Stober method, and/or a modification thereof.

In an embodiment of the method, the particles are impregnated using an incipient wetness technique, and/or a modification thereof.

In an embodiment of the method, the particles are coated using a free radical polymerization technique, and/or a modification thereof.

CMP slurries are used to planarize and/or polish a wafer surface. Therefore, a further aspect of the invention is a method of planarizing and/or polishing a wafer surface comprising performing the chemical mechanical planarization process, wherein the slurry utilized in the process is any of the slurries as disclosed herein. In an embodiment of the method, the wafer surface to be planarized and/or polished comprises a metal, a metal oxide, an oxide, a nitride, a polymer material, and/or any combination thereof. In an embodiment of the method, the wafer surface comprises Copper, Tungsten, Tantalum, Tin, Tantalum nitride, Silicon nitride, Aluminum, Nickel, Nickel Phosphor, Nickel nitride, Silver, Gold, Platinum, Ruthenium, and/or any combination thereof. In an embodiment of the method, the wafer surface comprises tetraethylorthosilicate, $Ni_3Si_4$, silica, diamond, SiC, polysilicon, and/or any combination thereof. In an embodiment of the method, the chemical mechanical planarization process is Copper CMP, shallow trench isolation CMP, Tungsten CMP, interlayer dielectric CMP, or polysilicon CMP.

In an embodiment, the invention comprises a copper CMP slurry containing glycine impregnated silica nanoparticles capable of localized simultaneous abrasion and dissolution of the copper surface. In an embodiment, the polymer encapsulated glycine impregnated nanoparticles release the copper complexing agent (glycine) only upon contact with the wafer surface, a nano sized contact release capsule (herein referred to as nano-CRC). The advantages of using the contact release capsule, as disclosed herein, in copper CMP slurries include the following:

1) Increasing planarization efficiency (ratio of step height reduction and removed layer thickness) by decreasing surface dissolution—This will reduce dishing and erosion of the copper wiring and decrease the amount of Cu overfill required incoming to Cu CMP.
2) Eliminating a majority of the chemical additives that are currently required in copper CMP slurries
3) Reducing particle agglomeration by improving the dispersion stability, which also controls the MRR These advantages ultimately lead to a reduction in the cost of CMP processing while also improving processing tolerances.

Copper CMP is a complex process because of the highly reactive nature of the copper surface. The most common copper CMP slurries use colloidal silica abrasive particles dispersed in aqueous solutions that contain an oxidizer, as well as a complexing agent and corrosion inhibiting agents and other chemicals. FIG. 2 illustrates the standard Cu CMP process.

Researchers have concurred that the mechanism of removal of the copper during CMP involves oxidation of a thin layer of the copper surface, which is then easily abraded by the nanoparticle, followed by immediate oxidation of the newly exposed copper, as described in the following literature "*Effect of CMP Slurry Chemistry on Copper Nanohardness*", R. V. Ihnfeldt and J. B. Talbot, *J. Electrochemical Soc.*, 155, H412 (2008). The pH and chemistry of the slurry solution must be controlled to allow quick formation of the copper oxide film on the wafer surface. Typically an oxidizer, such as hydrogen peroxide, is added to increase the rate of formation of the copper oxide film. To facilitate a high MRR, a complexing agent, such as glycine is required. FIG. 3 compares the potential-pH diagrams of the copper-water system and the copper-water-glycine system, showing that for the majority of CMP slurry conditions (pH 3-8), when glycine is present in the system, the most thermodynamically stable form is the soluble copper-glycine complex, $CuHL^{2+}$, $CuL^+$, $CuL_2$, and $CuL_2^-$, where L is $H_2NCH_2COO$. The reaction mechanisms for acidic, neutral, and basic conditions have been presented in detail in "*Effect of CMP Slurry Chemistry on Copper Nanohardness*", by R. V. Ihnfeldt and J. B. Talbot, and are summarized as follows:

1) Passivation of the copper surface to form an oxide or hydroxide
2) Complex formation with glycine to form a solid copper-glycine substance
3) Dissolution of the copper-glycine substance The complexing agent quickly reacts with the copper oxide once it is formed on the surface to dissolve it into solution. Unfortunately, because the complexing agent is exposed to the entire copper surface, corrosion or dissolution of the copper surface often occurs in unwanted places, and increases the potential for dishing and erosion of the copper wiring. This dissolution also decreases the planarization efficiency and requires an increase in the incoming copper plating thickness in order to accommodate for it, which adds cost to the wafer processing. A corrosion inhibitor is sometimes added to prevent the dissolution, but this tends to prevent the glycine-copper oxide complex reaction, and decreases the MRR. Further compounding these issues is that all these chemical additives increase the ionic strength of the solution and destabilize the nanoparticle dispersion, so that a surfactant may be required to prevent agglomeration of the particles, also see S. Pandija, D. Roy, and S. V. Babu, in "*Microelectronic Engineering*", 86, 367 (2009). FIG. 4 illustrates the typical mechanisms that occur during standard copper CMP processing.

It should also be noted that abrasive-free solutions have also been developed for copper CMP, which are typically used when the underlying material is a fragile "low-k" material. However, these abrasive-free processes require special pads and conditioners, and are slower (lower MRRs) than the slurries utilizing abrasives. They may even require the purchase of a new CMP tool to perform (i.e. an electro-CMP or ECMP tool), thus, many manufacturers are reluctant to use abrasive-free solutions unless it is absolutely necessary. Because the abrasive-free processes are so expensive, many manufacturers have even found tougher "low-k" materials that are compatible with a traditional abrasive polish.

Many of the issues occurring during copper CMP are due to the disconnect between the complexing chemical action and the abrasive mechanical action, that is, the complexing agent acts on the wafer globally, while the mechanical abrasion is a localized action. By combining the complexing agent into the nanoparticles, these issues can be eliminated. FIG. 5 illustrates the mechanism of the nano-CRC technology, as disclosed herein, used in a copper CMP slurry. The copper surface is simultaneously mechanically and chemically removed when contacted by the glycine impregnated nanoparticle. The abraded copper pieces are immediately dissolved into solution by the glycine. The glycine does not affect any other part of the copper surface, eliminating the need for additional chemicals (i.e. corrosion inhibitors and surfactants).

A method for manufacturing the contact release capsule is disclosed herein. In an embodiment, the silica nanoparticles can be synthesized using a similar method to that developed by Choi et al. K. S. Choi, R. Vacassy, N. Bassim, and R. K. Singh, *Mat. Res. Soc. Symp. Proc.*, 671 (2001). This is a modified Stober method, a precipitation technique based on controlled hydrolysis of a silicon alkoxide in a mixture of ethanol, aqueous ammonia and water. Choi et al. found that the addition of glycerol to the water/ammonia/ethanol mixture produces porous silica nanospheres, where the concentration of the glycerol in the mixture can be adjusted to get the desired porosity. Using this method silica nanoparticles with wide range of porosities are possible. In an embodiment, silica nanoparticles with porosities of up to ~0.1 $cm^3/g$ are synthesized. In an embodiment, silica nanoparticles with porosities of up to ~0.2 $cm^3/g$ are synthesized. In an embodiment, silica nanoparticles with porosities of up to ~0.3 $cm^3/g$ are synthesized. In an embodiment, silica nanoparticles with porosities of up to ~0.4 $cm^3/g$ are synthesized. In an embodiment, silica nanoparticles with porosities of up to ~0.5 $cm^3/g$ are synthesized. In an embodiment, silica nanoparticles with porosities of up to ~0.6 $cm^3/g$ are synthesized.

In an embodiment, after synthesis of the porous nanoparticles, the solvent is dried off, leaving the porous nanoparticles in powder form for impregnation.

In an embodiment, impregnation of the silica nanoparticles is done by the incipient wetness technique. In an embodiment, this method requires dissolving the impregnate into an aqueous or organic solvent. Then the impregnate-containing solution is added to the support material containing the same pore volume as the volume of solution that was added. Capillary action draws the impregnate solution into the pores. The support material can then be dried and calcined to drive off the volatile components within the solution, depositing the impregnate in the pores of the support material. The maximum loading is limited by the solubility of the impregnate in the solvent. Singh et al. have successfully impregnated silica and alumina nanoparticles with a variety of organic compounds using the incipient wetness technique, see the literature B. Singh, A. Saxena, A. K. Nigam, K. Ganesan, and P. Pandey, *J. Hazardous Materials*, 161, 933 (2009). One important aspect to consider when impregnating the nanoparticles with glycine is the optimal loading volume. Singh et al. easily loaded their nanoparticles up to 15 wt % with the various chemicals. However, the effect of the glycine loading on the copper CMP process will need to be considered. Putting too much glycine in the particles may cause the particles to settle, or create uncontrollable localized etching on the wafer surface during polishing. If too little glycine is impregnated into the particles, planarization efficiency and MRR may be too low.

In an embodiment, the nanoparticle loading with glycine is comparable to the concentration of typical copper CMP slurries. For example, typical concentrations of glycine in copper CMP slurries range from ~0.01-0.2M, with the concentration of abrasives in the slurry ranging from 1-20 wt %, see *Modeling Material Removal Rates for Copper CMP Using Copper Nanohardness and Etch Rates*, R. V. Ihnfeldt and J. B. Talbot, *J. Electrochemical Soc.*, 155, H582 (2008). Considering a standard copper CMP slurry with 0.1M glycine and 10 wt % silica, a 1 L solution contains ~7.5 g of glycine and ~130 g of silica. Using the synthesized porous silica nanoparticles at the same concentration (10 wt %) with a porosity of ~0.1 $cm^3/g$, then ~13 $cm^3$ of volume is available inside the silica particles for impregnation. Using the incipient wetness technique the maximum loading volume of the glycine is limited by the solubility of the glycine in the chosen solvent.

In an embodiment, the chosen solvent for impregnation is water. In water, the solubility of glycine is ~25 g/100 ml, which would allow ~3.3 g of glycine to be loaded into the 130 g of silica. In an embodiment, use of a much stronger solvent, such as dimethylsulfoxide (DMSO) or chloroform, will allow for increased loading with glycine solubilities of ~37 g/100 ml of DMSO and ~46 g/100 ml of chloroform. Therefore, it is possible to incorporate a comparable amount of glycine into the silica nanoparticles as that found in standard copper CMP slurries. The stronger solvents (DMSO, chloroform, etc.) can also be used to obtain higher loading volumes of glycine, however, they may require the use of a rotary evaporator or lyophilizer to dry off the solvent. These machines are quite common and used often by pharmaceutical manufacturers to dry drug compounds. Obviously, increasing the porosity of the synthesized silica allows for more glycine loading, possibly using more easily evaporated solvents, such as ethanol or methanol. However, it should be noted that the optimal amount of glycine required in the contact release capsule for a copper CMP slurry may be comparably less than that required in standard slurries as the localized glycine concentration at the particle surface is much higher. The high glycine concentration at the particle surface is exactly where the glycine is needed when it contacts the wafer surface.

CMP slurries consist of aqueous dispersions of nanoparticles, therefore, the contact release capsules must be dispersed in water to be used in the CMP process. Glycine is highly soluble in water, and therefore, a polymer coating of the impregnated particle must be done to prevent the hydration of the silica nanoparticles and dissolution of glycine. Obviously, if the glycine dissolves out of the particle and into solution prior to contacting the wafer surface during CMP, then the slurry would have no new advantages over current CMP slurry technologies.

There are many processes available for coating particles. Typical liquid-phase coating processes include reverse micelles method, liquid precipitation method, and sol-gel method. Gas-phase coating methods such as chemical vapor deposition, physical vapor deposition, and plasma coating are also available, but with much higher operating costs, see Y. S.

Chung, S. A. Song, and S. B. Park, *Colloids and Surfaces A: Physicochem. Eng. Aspects,* 236, 73 (2004). Many researchers have also developed new techniques for coating nanoparticles. Wang et al. developed a method to encapsulate nanoparticles in a polymer using a supercritical anti-solvent process, see Y. Wang, R. N. Dave, and R. Pfeffer, *Journal of Supercritical Fluids,* 28, 85 (2004). Additionally, Chung et al. successfully created hydrophobic silica nanoparticles using an aerosol spray reactor process.

One aspect to consider is that the coating or surfactant must be stable enough to last at least one year, that is, completely insoluble in water and non-degradable. Typical slurry shelf-life is between 1 and 3 years and the products are sold pre-dispersed and ready for use. It may be possible to develop a slurry which sells as a dry powder and is dispersed just before use, but this would be much more difficult to commercialize as manufacturers are reluctant to change, and it would still need to be stable for at least 24 hours or the cost of labor to continually manage the mixing will be too high.

Furthermore, the coating or surfactant must be easily penetrable when the particle comes into contact with the wafer surface, so that the glycine is easily released when needed. Previous work determined the shear force on a 200 nm abrasive particle during a typical copper CMP process is ~3.6× $10^{-10}$ N (this is with a wafer down force of ~1 psi), see *Modeling of Copper CMP Using the Colloidal Behavior of an Alumina Slurry with Copper Nanoparticles,* R. Ihnfeldt and J. Talbot, *J. Electrochemical Soc.,* 154, H1018 (2007). So the shearing strength of the coating needs to be just less than this number to allow release of the glycine upon contact with the copper wafer surface. Additionally, the chosen coating process must maintain the integrity of the impregnated nanoparticles (i.e. no solvents can be used during the coating process in which glycine is soluble).

In an embodiment a polymer coating is used to encapsulate the impregnated nanoparticles. Recently, polymer coating of magnetic nanoparticles has sparked much interest in the biotechnology field due to the possible use of these particles in targeted drug delivery systems, magnetic resonance imaging, and DNA and RNA separation. Researchers typically utilize a free radical polymerization method to coat the nanoparticles with the desired polymer, see S. R. Bhattarai, R. B. Kc, S. Y. Kim, M. Sharma, M. S. Khil, P. H. Hwang, G. H. Chung, and H. Y. Kim, *Journal of Nanobiotechnology,* 6, 1 (2008). This method involves the creation of free radical monomer units, which then rapidly grow polymer chains with the successive addition of polymer building blocks. Numerous experimental procedures and techniques for radical polymerization are defined in the literature, see K. Matyjaszewski and T. P. Davis, *Handbook of Radical Polymerization,* Hoboken: Wiley-Interscience (2002), and T. Wang and J. L. Keddie, *Advances in Colloid and Interface Science,* 147-148, 319 (2009). Korolyov and Mogilevich estimate more than 400 publications devoted to new free radical polymerization methods appeared between 2004-2007, which illustrates the enormous growth within this area of science, see G. V. Korolyov and M. M. Mogilevich, *Three Dimensional Free-Radical Polymerization,* Springer-Verlag, Berlin Heidelburg (2009). Additionally, several methods to polymer coat nanoparticles using radical polymerization have been detailed in the literature including the use of polyethyleneglycol (PEG), poly-L-lysine (PLL), poly-vinyl alcohol (PVA), and polysaccharides, see Y. Zhang and J. Zhang, *Journal of Colloid and Interface Science,* 283, 352 (2005), H. S. Lee, E. H. Kim, H. Shao, and B. K. Kwak, *Journal of Magnetic Materials,* 293, 102 (2005), J. S. Kin, T. J. Yoon, K. N. Yu, M. S, Noh, M. Woo, B. G. Kim, K. H. Lee, B. H. Sohn, S. B. Park, J. K. Lee, and M. H. Cho, *Journal of Veterinary Science,* 7, 321 (2006), R. Trehin, J. L. Figueiredo, M. J. Pittet, R. Weissleder, L. Josephson, and U. Mahmood, *Neoplasia,* 8, 302 (2006), and J. H. Clement, M. Schwalbe, N. Buske, K. Wagner, M. Schnabelrauch, P. Gornert, K. O. Kliche, K. Pachmann, W. Weitschies, and K. Hoffken, *Journal of Cancer Research and Clinical Oncology,* 132, 287 (2006). Bhattarai et al. successfully coated iron oxide nanoparticles with N-hexanoyl chitosan. Herrera et al. coated cobalt ferrite nanoparticles with poly(N-isopropylacrylamide) (pNIPAM) and poly(N-isopropylmethacrylamide) (pNIPMAM) and showed the coated particles were actually less agglomerated in aqueous solutions than non-polymer coated particles, see A. P. Herrera, C. Barrera, Y. Zayas, and C. Rinaldi, *Journal of Colloid and Interface Science,* 342, 540 (2010). One of the difficulties that has been encountered with using impregnated and polymer coated nanoparticles for drug delivery is the poor stability of these particles in solution. It is important to note, however, that the drug delivery products usually employ a timed release mechanism, while the nano-CRC release mechanism is physical abrasive contact with the wafer surface during CMP. This type of mechanical release mechanism will allow for the use of much tougher, and/or thicker polymer coatings, which will enable the particles to be much more stable than the solutions prepared for drug delivery.

Of the more common addition polymers, polyethylene (LDPE), atactic polypropylene, poly(vinyl acetate) (PVAc), and cis-polyisoprene, are all soft and easily deform under shear. LDPE is soluble in water and therefore unusable in the nano-CRC slurry. Atactic polypropylene is both insoluble in water and does not adsorb water, which would be perfect for coating the impregnated particles except that it can only be synthesized by the Ziegler-Natta polymerization technique, which is much more difficult and requires more expensive catalysts. PVAc is insoluble in water and commonly used in paints or protective coatings, which makes it a good candidate for the nano-CRC slurry. PVAc is easily prepared by free radical polymerization of vinyl acetate monomer. Cis-polyisoprene would not be useful for this project as it is also difficult to synthesize.

In an embodiment, the polymer coating of the contact release capsule comprises PVAc. PVAc is easily synthesized and the monomer units are inexpensive and readily available. Several commercial sources of soft polymer materials are also available. Soft Polymer Systems Inc. offers several gel type materials for coatings and paints which may work well with the contact release capsules disclosed herein.

In an embodiment, a similar method to that developed by Herrera et al. is used to coat the impregnated particles. In an embodiment, the polymer coating of the contact release capsule comprises pNIPAM or pNIPMAM. The smart polymer substances, pNIPAM and pNIPMAM, are both insoluble in water and non-degradable. They are soft gel-like polymers which easily deform with shear. The nanoparticle coating process requires the use of hexane, acetone, and diethyl ether, in all of which glycine is virtually insoluble. The thickness of the coating needs to be optimized to prevent glycine diffusion and dissolution from inside the particle, while also being easily penetrable when contacted by the copper wafer surface. The pNIPAM and pNIPMAM polymers are smart polymers in that they are temperature sensitive and change from hydrophilic to hydrophobic above 33 and 40° C., respectively. This could potentially be advantageous for post CMP cleans as the temperature sensitivity could be utilized to help remove the polymer from solution. However, should pNIPAM or pNIPMAM be utilized as the coating on the contact release capsules for a copper CMP slurry, a constant temperature storage and delivery of the product will be required (most CMP slurries already require constant temperature storage, so this is not necessarily an issue). Furthermore, S. R. Pullela found that the pNIPAM material also varies in hardness with the solution pH. At low pH the pNIPAM exhibits properties of a hard colloid, while at high pH the material is a soft gel, see S. R. Pullela, Ph.D. Dissertation, Texas A&M University (2009). This sensitivity to pH could also be utilized to increase shelf life of the nano-CRC slurry by formulating and storing the slurry at a low pH, so the polymer is hard and not easily deformed, completely preventing glycine escape from the particle. Then, just prior to CMP the slurry can be mixed with a solution to raise the pH and soften the polymer so that it will easily deform when contacted by the copper wafer surface and allow the glycine to react immediately with the abraded copper pieces. Point of use (POU) slurries, or slurries that are mixed together just prior to being dispensed onto the platen are quite common, (especially for shallow trench isolation CMP), and most standard industrial CMP machines are equipped to handle the mixing for these types of slurries.

Once the impregnated particles have been coated with the protective polymer material, they need to be dispersed into an aqueous solution. There are a variety of techniques that can be utilized to disperse the contact release capsules into a solution. In an embodiment, the contact release capsules are dispersed into solution by ultrasonication, pH adjustment, and/or addition of various electrolytes to control the ionic strength of the solution and increase the electrostatic repulsion between the particles.

In an embodiment, the copper CMP slurry containing the contact release capsules, as disclosed herein, is designed to decrease unwanted corrosion of the copper surface. In an embodiment, the copper CMP slurry containing the contact release capsules, as disclosed herein, is designed to maintain adequate and controllable MRR. In an embodiment, the copper CMP slurry containing the contact release capsules, as disclosed herein, is designed to improve planarization efficiency.

Measurement of the chemical etch rate of the slurry gives a good indication of whether or not the slurry will corrode the copper surface during CMP, leaving unwanted pits and cracks in the copper wiring. Table 1 shows the measured chemical etch rates of typical copper CMP slurry formulations along with the CMP MRR using standard slurry formulations with alumina nanoparticles. For the most part, solutions with high etch rates have high MRRs, while solutions with low etch rates have low MRRs. The solutions that have high etch rates also cause pitting and corrosion on the copper wafer surface, as is discussed in detail in the literature. From Table 1, only one possible solution would be adequate for use in the copper CMP process, that is the solution with glycine, $H_2O_2$, SDS, and BTA at pH 10.8. This solution has a reasonably low chemical etch rate, 8.6 nm/min, with a reasonably high MRR, 242 nm/min. However, it takes four chemical additives and a fairly alkaline solution to get a "good enough" slurry. A slurry with a zero chemical etch rate, and an MRR greater than 250 nm/min would be much more attractive.

In designing a copper CMP slurry using the contact release capsules, as disclosed herein, the solution pH, silica porosity, glycine loading, polymer type, and polymer thickness parameters may all be varied to optimize the solution to yield the desired properties during CMP.

TABLE 1

Measured Chemical Etch Rates and CMP MRR for standard alumina slurry formulations, (data from R. Ihnfeldt PhD Dissertation, University of California San Diego, 2008).

| Aqueous Alumina Slurry Components | pH | Chemical Etch Rate (nm/min) | CMP MRR (nm/min) |
|---|---|---|---|
| 1 mM $KNO_3$ | 2.9 | 0.7 | 4 |
| | 8.3 | 0 | 4 |
| | 11.7 | 2.6 | 0 |
| 1 mM $KNO_3$, 0.1M Glycine | 3.1 | 1.2 | 2 |
| | 8.5 | 7.6 | 9 |
| | 10.0 | 0 | 15 |
| 1 mM $KNO_3$, 0.1M Glycine, 0.1 wt % $H_2O_2$ | 3.0 | 45 | 8 |
| | 8.3 | 33 | 287 |
| | 10.0 | 14 | 350 |
| 1 mM $KNO_3$, 0.1M Glycine, 2.0 wt % $H_2O_2$ | 3.0 | 37.5 | 113 |
| | 8.3 | 55.5 | 289 |
| | 10.0 | 33.1 | 166 |
| 1 mM $KNO_3$, 0.1M Glycine, 0.1 wt % $H_2O_2$, 0.01 wt % BTA, 0.1 mM SDS | 3.0 | 1.6 | 0 |
| | 8.4 | 0 | 11 |
| | 10.8 | 8.6 | 242 |

The invention is now further described by the following preferred embodiments and examples, which are intended to be illustrative of the invention, but are not intended to limit the scope or underlying principles in any way.

EXAMPLES

Porous Silica Synthesis

In an embodiment, porous silica nanoparticles are synthesized using a similar method to that described by Choi et al. in *Material Research Society Symposium Proceeding*, volume 671 (2001), which is hereby incorporated by reference in its entirety. This is a modified Stober method, a precipitation technique based on controlled hydrolysis of a silicon alkoxide in a mixture of ethanol, aqueous ammonia and water. Choi et al. found that the addition of glycerol to the water/ammonia/ethanol mixture produces porous silica nanospheres, where the concentration of the glycerol in the mixture can be adjusted to get the desired porosity. Using this method silica nanoparticles with various porosities (greater than 0.4 $cm^3/g$) are possible. Table 2 below shows the results of various glycerol concentrations on the silica particle porosity. For each condition the concentration of ammonia, water, and TEOS was fixed at 0.2M, 3.2M, and 0.2M, respectively. Micropore volume was measured by Mercury Intrusion Analysis. Reaction time for these experiments was ~17 hours. The particle size can be varied by adjusting the reaction time accordingly. Particle sizes were measured in an aqueous solution using a dynamic light scattering technique with a ZetaPLUS machine from Brookhaven Instruments Inc., and measurements were visually verified by Scanning Electron Microscope (SEM).

TABLE 2

Micropore volume of silica particles synthesized with various concentrations of glycerol.

| Glycerol Concentration (M) | Particle Size (nm) | Micropore volume ($cm^3/g$) |
|---|---|---|
| a) 0.01M | 169 | 0.3489 |
| b) 0.05M | 199 | 0.3766 |
| c) 0.1M | 209 | 0.3829 |
| d) 0.5M* | 251 | >0.4 |

*estimated value, high porosity gave unreliable results

Impregnation of Silica

In an embodiment, impregnation of the silica nanoparticles is done by the incipient wetness technique. This method requires dissolving the impregnate into an aqueous or organic solvent. Then the impregnate-containing solution is added to the support material containing the same pore volume as the volume of solution that was added. Capillary action draws the impregnate solution into the pores. The support material can then be dried and calcined to drive off the volatile components within the solution, depositing the impregnate in the pores of the support material.

Table 3 below shows the quantitative SEM-EDX analysis of the 0.3829 $cm^3/g$ porous silica nanoparticles (synthesized using 0.1M glycerol) before and after glycine loading using a glycine saturated aqueous solution (25 g/100 ml). The elemental analysis of the particles before glycine loading are consistent with the formation of $SiO_2$, while after glycine loading the quantity of Nitrogen, Oxygen, and Carbon significantly increases, indicating successful particle loading of glycine crystals (small impurities of Na, Mg, K, and Ca are most likely from the water used to load the glycine).

TABLE 3

SEM-EDX analysis of dried 0.3829 $cm^3/g$ porous silica nanoparticles a) before and b) after glycine loading using a glycine saturated aqueous solution (25 g/100 ml).

| Element | App Conc. | Intensity Corrn. | Weight % | Weight % Sigma | Atomic % |
|---|---|---|---|---|---|
| a) | | | | | |
| C | 2.94 | 0.1983 | 7.02 | 1.33 | 11.14 |
| O | 71.73 | 0.6762 | 50.29 | 0.90 | 59.89 |
| Si | 82.45 | 0.9156 | 42.69 | 0.78 | 28.96 |
| Totals | | | 100.00 | | |
| b) | | | | | |
| C | 114.8 | 0.5119 | 37.18 | 1.37 | 45.96 |
| N | 6.09 | 0.0967 | 10.44 | 2.17 | 11.07 |
| O | 85.76 | 0.3746 | 37.96 | 1.20 | 35.22 |
| Na | 8.41 | 0.6449 | 2.16 | 0.11 | 1.40 |
| Mg | 1.99 | 0.6124 | 0.54 | 0.05 | 0.33 |
| Si | 54.32 | 0.8425 | 10.69 | 0.33 | 5.65 |
| K | 0.96 | 1.0183 | 0.16 | 0.03 | 0.06 |
| Ca | 5.04 | 0.9700 | 0.86 | 0.05 | 0.32 |
| Totals | | | 100.00 | | |

Polymer Coating

In an embodiment, a polymer coating technique to encapsulate the impregnated nanoparticles is used which is similar to the technique developed by Herrera et al., in the *Journal of Colloid and Interface Science*, volume 342, issue 540 (2010), which is hereby incorporated by reference in its entirety. This technique uses pNIPAM, which is a smart polymer substance that is insoluble in water and non-degradable. It is a soft gel-like polymer which easily deforms with shear. The nanoparticle coating process requires the use of hexane, acetone, and diethyl ether, in all of which glycine is virtually insoluble. The thickness of the coating can be controlled by adjusting the chemistry and polymerization reaction time.

Prior to polymer coating, porous particles were loaded with glycine using a glycine saturated aqueous solution (25 g/100 ml), and dried in an oven at 110° C. overnight. To prepare the particles for polymer coating, they were suspended in a solution of hexane and 3-(trimethoxysilyl)propyl methacrylate (MPS), and stirred at room temperature for 2 days. The functionalized MPS coated silica particles were then separated from the solution using centrifugation (3400 rpm for 15 min) and washed twice with acetone. The particles were then coated with covalently attached pNIPAM through free radical polymerization using α,α'-azobisisobutyronitrile (AIBN) initiator and N,N' methylene bisacrylamide (MBA) crosslinking agent. The MPS coated silica particles were suspended in 20 ml of acetone at ~0.5% w/v and mixed in a flask with 10 ml of a solution of 25% w/v NIPAM in acetone, along with 10 ml of 0.5 g AIBN dissolved in acetone, and 10 ml of 0.125 g MBA dissolved in acetone. The reaction was sealed and carried out at 60° C. for 9 hours under continuous stifling at 100 rpm. After polymerization the particles were separated by centrifugation at 3400 rpm for 15 minutes, washed twice with diethyl ether/acetone (3:1), and dried at room temperature. The coated particles were easily suspended in DI water using ultrasonication, and particle sizes were measured by dynamic light scattering technique using a Brookhaven ZetaPlus machine. Visual verification of the particle sizes was done by SEM, and these results were consistent with particle size measurements taken in aqueous solution, which are listed in Table 4 below. Coating thickness decreased with increasing porosity, possibly due to the increased pores on the particle surface inhibiting the attachment of the coating. The particles with the lowest porosity (0.3489 $cm^3/g$) had the thickest polymer coating of ~50 nm. The particles with similar porosities (0.377 and 0.383 $cm^3/g$) were coated with a ~35 nm NIPAM film. However, the particles with high porosity>0.4 $cm^3/g$ had very little if any polymer coating (<4 nm), as the increased pores on the surface of the particle may inhibit the attachment of the coating.

TABLE 4

Particle size measurements performed in aqueous solutions using a dynamic light scattering technique.

| Porosity ($cm^3/g$) | Porous Particle Size (nm) | Polymer Coated Particle Size (nm) |
|---|---|---|
| 0.3489 | 169 | a) 270 |
| 0.3766 | 199 | b) 269 |
| 0.3829 | 209 | c) 277 |
| >0.4 | 251 | d) 255 |

Although the foregoing description has shown, described, and pointed out the fundamental novel features of the present teachings, it will be understood that various omissions, substitutions, and changes in the form of the detail of the invention as illustrated, as well as the uses thereof, may be made by those skilled in the art, without departing from the scope of the present teachings. Consequently, the scope of the present teachings should not be limited to the foregoing discussion, but should be defined by the appended claims. All patents, patent publications and other documents referred to herein are hereby incorporated by reference in their entirety.

What is claimed is:

1. A contact release capsule comprising a particle, a chemical payload, and an organic polymer coating, wherein:
   the particle comprises a pore or pores which can be impregnated with a chemical payload,
   the organic polymer coating is present on an outside surface of the particle and is configured to contain the chemical payload in the pore or pores, wherein the organic polymer coating comprises polyvinyl acetate,
   the organic polymer coating is configured to be removable from the outside surface of the particle to release the chemical payload from the pore or pores by a shearing contact force with a wafer surface during a chemical mechanical planarization process, and the particle has a porosity of equal to or greater than about 0.01 cm$^3$/g.

2. The contact release capsule of claim 1, wherein the particle comprises a material selected from the group consisting of fumed silica, colloidal silica, fumed alumina, colloidal alumina, ceria, MnO$_2$, ZnO, TiO$_2$, polymer and combinations thereof.

3. The contact release capsule of claim 1, wherein the particle is spherical.

4. The contact release capsule of claim 3, wherein the size of the particle is in the range of about 10 nm to about 1 μm.

5. The contact release capsule of claim 1, wherein the chemical payload comprises a complexing agent selected from the group consisting of organic polymer, alkaline agent, organic amine, and combinations thereof.

6. The contact release capsule of claim 1 wherein the chemical payload is a compound selected from the group consisting of glycine ethylene-diamine-tetra-acetic-acid, alanine, phthalic acid, citric acid, oxalic acid acetic acid, tartaric acid, succinic acid, amino acid, ammonium hydroxalate, lactic acid, carboxylic acid, organic amine, and combinations thereof.

7. The contact release capsule of claim 1, wherein the organic polymer coating further comprises a polymer selected from the group consisting of polyacrylate, polymethacrylate, polyethyleneglycol, poly-L-lysine, poly-vinyl alcohol, polysaccharide, polyethylene, polypropylene, polyisoprene, and combinations thereof.

8. The contact release capsule of claim 1, wherein the organic polymer coating further comprises poly(N-isopropylacrylamide) or poly(N-isopropylmethacrylamide).

9. The contact release capsule of claim 1, wherein the thickness of the organic polymer coating on the capsule is in the range of about 1 nm to about 1 μm.

10. The contact release capsule of claim 1, wherein the capsule has a size in the range about 10 nm to about 1 μm.

11. The contact release capsule of claim 10, wherein the size of the capsule is in the range of about 150 nm to about 350 nm.

12. The contact release capsule of claim 1, wherein the particle comprises colloidal silica.

13. The contact release capsule of claim 1, wherein the chemical payload comprises glycine.

14. The contact release capsule of claim 1, wherein the particle comprises colloidal silica and the chemical payload comprises glycine.

15. The contact release capsule of claim 1, wherein:
the particle comprises colloidal silica;
the chemical payload comprises glycine;
the particle has a size in the range of about 10 nm to about 300 nm;
the organic polymer coating has a thickness in the range of about 1 nm to about 1 μm; and
the particle has a porosity in the range about 0.01 cm$^3$/g to about 0.5 cm$^3$/g.

16. The contact release capsule of claim 15, wherein the thickness of the organic polymer coating is in the range of about 2 nm to about 50 nm.

17. The contact release capsule of the claim 1, wherein the porosity is in the range of about 0.01 cm$^3$/g to about 0.6 cm$^3$/g.

18. The contact release capsule of claim 1, wherein:
the particle comprises a material selected from the group consisting of fumed silica, colloidal silica, fumed alumina, colloidal alumina, ceria, MnO$_2$, ZnO, TiO$_2$, polymer, and combinations thereof;
the chemical payload comprises a compound selected from the group consisting of glycine, ethylene-diamine-tetra-acetic-acid, alanine, phthalic acid, citric acid, oxalic acid, acetic acid, tartaric acid, succinic acid, amino acid, ammonium hydroxalate, lactic acid, carboxylic acid, organic amine, and combinations thereof; and
the organic polymer coating, further comprises a polymer selected from the group consisting of polyacrylate, polymethacrylate, polyethyleneglycol, poly-L-lysine, polyvinyl alcohol, polysaccharide, polyethylene, polypropylene, polyisoprene, and combinations thereof.

\* \* \* \* \*